US007365398B2

(12) United States Patent
Tiwari et al.

(10) Patent No.: US 7,365,398 B2
(45) Date of Patent: Apr. 29, 2008

(54) COMPACT SRAMS AND OTHER MULTIPLE TRANSISTOR STRUCTURES

(75) Inventors: Sandip Tiwari, Ithaca, NY (US); Arvind Kumar, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 11/055,014

(22) Filed: Feb. 11, 2005

(65) Prior Publication Data

US 2005/0224994 A1 Oct. 13, 2005

Related U.S. Application Data

(60) Provisional application No. 60/543,329, filed on Feb. 11, 2004.

(51) Int. Cl.
*H01L 29/76* (2006.01)
*G11C 11/00* (2006.01)
(52) U.S. Cl. .............................. 257/368; 257/E27.098; 365/129

(58) Field of Classification Search ................. None
See application file for complete search history.

(56) References Cited

U.S. PATENT DOCUMENTS

| 6,248,626 B1 | 6/2001 | Kumar et al. |
| 6,281,551 B1 | 8/2001 | Chan et al. |
| 6,445,032 B1 | 9/2002 | Kumar et al. |
| 6,534,819 B2 | 3/2003 | Tiwari et al. |
| 6,770,940 B2 * | 8/2004 | Yamauchi .................. 257/368 |
| 6,864,519 B2 * | 3/2005 | Yeo et al. .................. 257/206 |
| 6,921,982 B2 * | 7/2005 | Joshi et al. ................ 257/349 |

* cited by examiner

*Primary Examiner*—Scott B. Geyer
(74) *Attorney, Agent, or Firm*—Jones, Tullar & Cooper, P.C.

(57) ABSTRACT

A highly dense form of static random-access memory (SRAM) takes advantage of transistor gates on both sides of silicon and high interconnectivity made possible by the complex form of silicon-on-insulator and three-dimensional integration. This technology allows one to form p-channel and n-channel devices very compactly by taking advantage of placement of gates on both sides, making common contacts and dense interconnections in 3D.

22 Claims, 11 Drawing Sheets

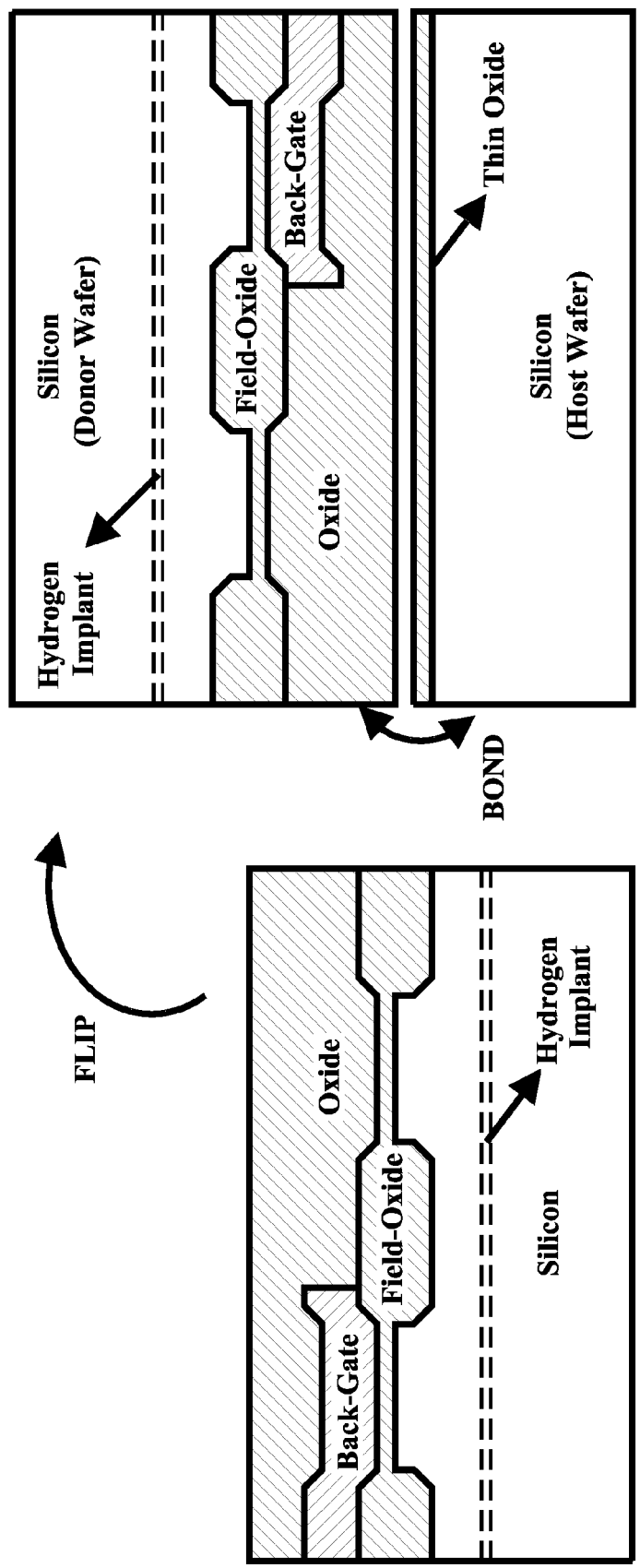

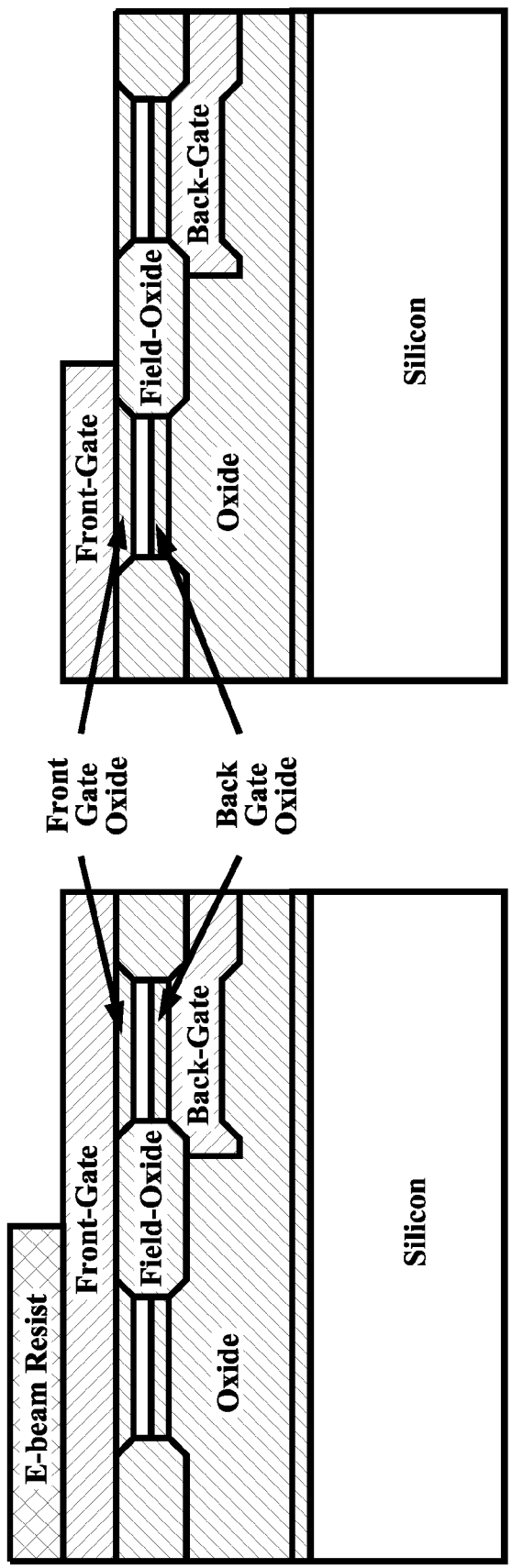

COMPACT SRAMS AND OTHER MULTIPLE TRANSISTOR STRUCTURES

CROSS REFERENCE TO RELATED APPLICATIONS

This application claims the benefit, under 35 U.S.C. 119(e), of U.S. Provisional Application No. 60/543,329, filed Feb. 11, 2004, which is hereby incorporated by reference.

GOVERNMENT SPONSORSHIP STATEMENT

The invention described herein was made with U.S. Government support under DARPA Contract No. N66001-00-C-8003. The government has certain rights in the invention.

BACKGROUND OF THE INVENTION

1. Field of the Invention

The present invention relates to semiconductor electronic circuit structures that selectively employ gates on two sides of device channel regions to reduce the area necessary for the circuit structures. The invention is particularly suited for use in a static random access memory (SRAM) of a very dense form and is applicable to nano-scale CMOS technology.

2. Description of the Background Art

The SRAM is the most common form of fast memory in digital electronic circuits. Indeed, for most common special, general-purpose and graphics processors, SRAMs occupy nearly half or more of the chip area. Use of fast local memories continues to increase as a fraction of the areas because it is the fastest way of improving performance currently. There are some specialized applications where the dynamic random access memories supplant SRAM when density is more important than speed. However, by and large, SRAMs are the preferred form of memory in systems-on-chip, in most logic applications, and in many levels of cache memory that enclose the processor.

The SRAM's most common form, however, uses 6 transistors that take up a large area (nearly 10 times the logic gate area). As an example, a planar device SRAM cell usually consists of 18 via-contacts to devices, 2 contacts to supplies and a total of 14 interconnects just within the cell. Thus, it usually takes nearly 80-100 squares of lithographic features even with common contacts in the cell-arrays. This is what causes an SRAM to have a large cell size. As devices have shrunk in dimension, there is increased use of silicon on insulator structures in order to improve the electrostatics. As devices shrink further in the sub-100 nm range, the expectation is that the technology will evolve to the use of very thin silicon films, double gates or some variations thereof, as well as three-dimensionally integrated structures are expected. The density of an SRAM is a major constraint in density and speed. A systems-on-chip (SOC) approach allows one to integrate SRAMs into a variety of applications beyond those of digital processors. Dense SRAMs, thus, have a major application range across the spectrum of most applications of electronics.

SUMMARY OF THE INVENTION

The present invention provides dense SRAM structures and other multiple transistor devices through use of gates that are formed on two sides of the conducting channels or active regions of the transistors. This arrangement allows compactness because it eliminates isolation areas, allows common contact areas, eliminates processing for some of the interconnects and makes some of the interconnects and via's self-aligned. In the present invention, placement of gates on two sides of the device channel allows a very efficient use of compaction through overlap of common areas, vertical contacts, etc. In addition, this ability allows further extensions where transistors are placed in an area previously used only for a contact or other such circuit-oriented need. Compactness of SRAM cells allows a very large improvement in the application to electronics because of their large usage in processors and systems-on-chip. In another variation of the invention, the arrangement allows for further compactness through use of a vertical structure for the access transistors.

The major advantage of the approach described here is that it provides a very compact static random access memory together with logic-oriented silicon transistors that have properties that will scale to the 10 nm gate length range. Thus, the approach allows the fabrication of both logic and fast dense memory-essential elements for most large scale integration applications of microelectronics.

The existence of the back-gate made possible by how the compact static-random access memory is made also allows the threshold voltage of logic transistors to be changed by using a suitably positioned back-gate. Thus, the power and the operational characteristics of the transistors can be modulated, and either extremely low power, or extremely high speed through higher conductivity, obtained by shutting down of sections of circuits, each become possible using this approach.

This approach also can be used with configurability. Thus, the static memory with pass transistor becomes a means to achieving a very dense configurable switch using pass transistors. Following approaches commonly employed in field-programmable gate arrays, programmable logic devices, etc., and dense configurable logic family can be achieved whose power can be controlled by the use of logic gate threshold voltages, or by shutting off sections of the logic blocks. Thus, unlike previous approaches to configurability, this approach allows a substantial improvement in compactness and power, while improving on scalability and speed and power of the operation of the circuits.

A number of approaches can be employed to fabricate the SRAM and logic structures constructed in accordance with the preferred embodiments of the present invention. Briefly, gates can be obtained on both sides by forming them in sequence. In the first approach, the gates for the back-side are formed first, and then bonded to a host silicon wafer. The process for getting the thin silicon layer can employ multiple approaches. One is to implant hydrogen, or co-implant hydrogen with species such as Helium, Boron, etc., which lead to exfoliation. Bonding such an implanted wafer of the gated structure with preferably oxide terminated surface that has extremely small roughness (less than 0.4 nm), and exfoliation through a higher temperature step leads to bonding with a silicon layer (similar to that of silicon-on-insulator) on the top of the surface with the buried gate underneath. An alternative to this is to replace the exfoliation step by using a silicon-on-insulator substrate. Thus, in this approach the gate that ultimately becomes the back-gate is formed first. After bonding the oxide, the silicon-on-insulator is used as a selective stop for removal of the substrate. In this approach therefore the unnecessary substrate is removed by appropriate combination of grinding, polishing and selective etching.

The other silicon processes employed in making of electronics employ the known CMOS techniques. These include, isolation techniques such as shallow-trench isolation and oxidation, the growth of insulators such as for oxides, nitrides, nitrided oxides or other replacement dielectrics, the formation of gates such as poly-silicon or metal gates, doping processes such as implantation and annealing or diffusion, the formation of silicides, deposition of dielectrics such as oxides, nitrides. organics or low-k materials, lithography, and etching processes.

Formation of the vertical transistors in the alternative embodiment can also similarly employ a number of similar alternative approaches. If the transferred silicon layer is thick, then etching it can provide the silicon layer on which the planar structures are fabricated. On the other hand, if the silicon layer is thin, then the vertical structure must be grown by dicholoro-silane based growth, or crystallization of deposited films.

BRIEF DESCRIPTION OF THE DRAWINGS

The features and advantages of the present invention will become apparent from the following detailed description of a preferred embodiment thereof, taken in conjunction with the accompanying drawings, in which.

DETAILED DESCRIPTION OF THE PREFERRED EMBODIMENTS

The preferred embodiments of the present invention all share one common feature. In each case, an electronic circuit structure is formed that includes at least two semiconductor transistors where one transistor has a gate formed on a first side of a channel region and a second transistor has a gate formed on a second, opposite side of the channel region. By clever use of this type of arrangement, very compact geometries of flip-flops or other multiple transistor structures, for example, can be achieved because the many contact areas and interconnect areas can be overlapped and cell sizes reduced.

Figure 1:
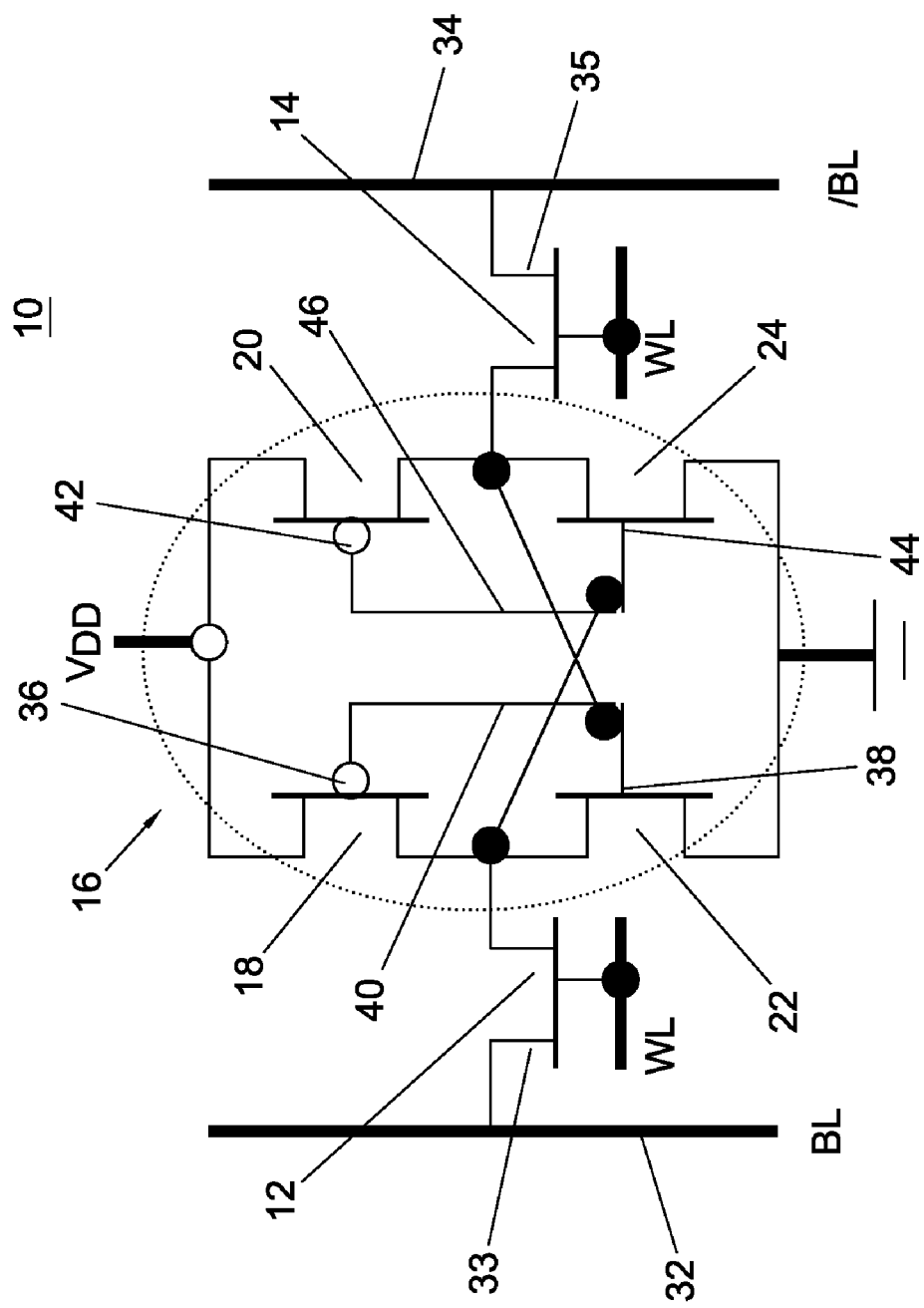
FIG. 1 shows a circuit schematic for an SRAM cell that can be constructed in accordance with a first preferred embodiment of the present invention.

With reference to FIG. 1, a circuit schematic of a typical SRAM cell 10 is illustrated. The circuit schematic is conventional, however, the structure employed to implement the circuit is not and is constructed in accordance with a first preferred embodiment of the invention as will be illustrated in conjunction with FIGS. 2-4. The SRAM cell 10 includes first and second access transistors 12 and 14 and a cross coupled inverter or flip-flop circuit 16. The cross coupled inverter circuit is implemented with a group of four transistors 18, 20, 22 and 24. A word line (WL) 26 is connected to each of the control gates 28 and 30 of the access transistors 12 and 14, respectively. A first bit line (BL) 32 is connected to either the source or the drain 33 of the first access transistor 12, while a second bit line (/BL) 34 that carries the complement signal of the first bit line 32, is connected to either the source or the drain 35 of the second access transistor 14. The gates 36 and 38 of the transistors 18 and 22, respectively, are coupled together with a line 40, while the gates 42 and 44 of the transistors 20 and 24, respectively, are coupled together with a line 46.

In operation, a signal is applied to the word line 26 to enable reading from and/or writing to the SRAM cell 10, depending on whether the first bit line 32 is high (1) or low (0). After data is written to the cell 10, the data is held by the cross coupled inverter circuit 16 without any refreshing being necessary, which is why the SRAM cell is referred to as being "static."

Figure 2:
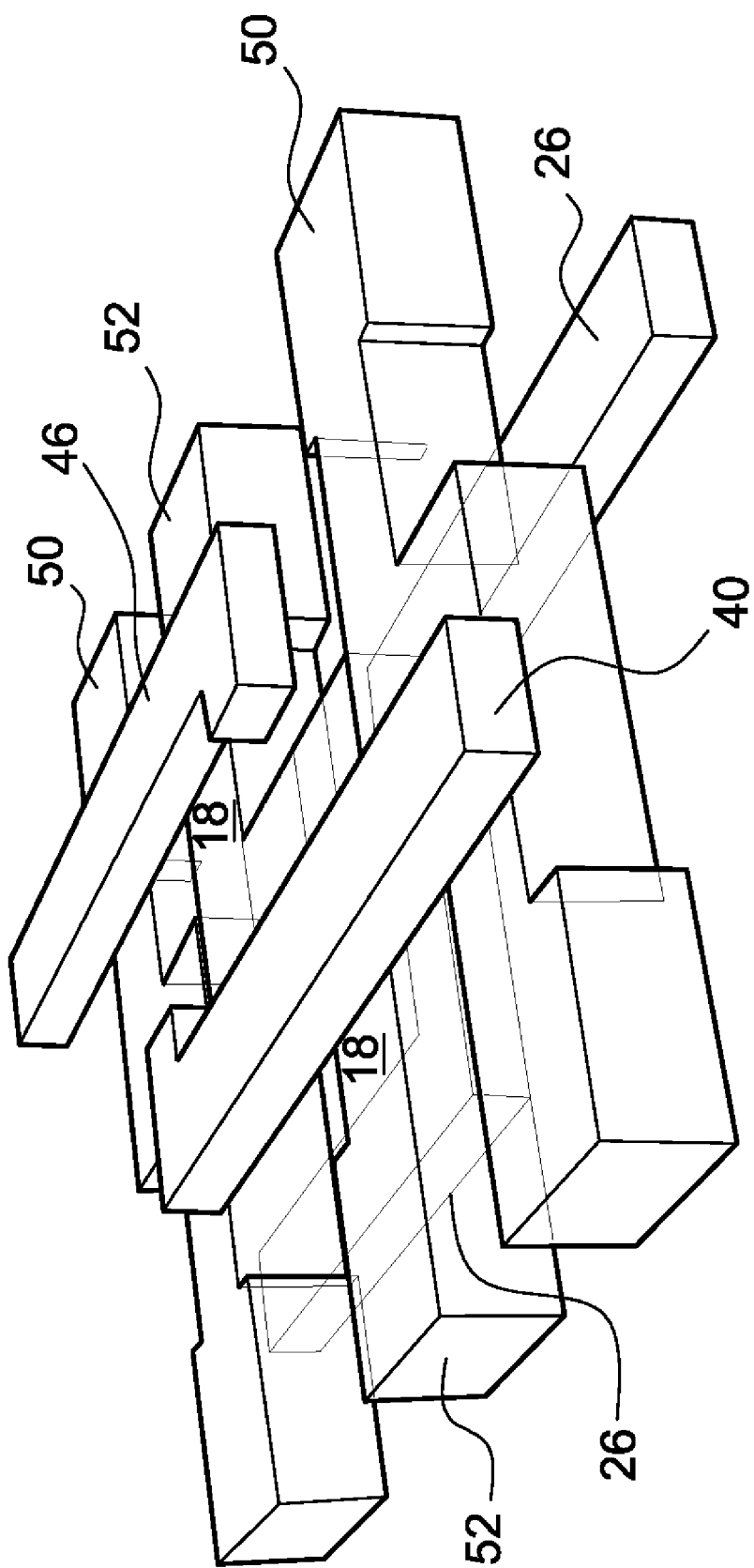
FIGS. 2 and 3 are perspective views of simulations of an SRAM cell structure constructed in accordance with a first preferred embodiment of the invention.
Figure 3:
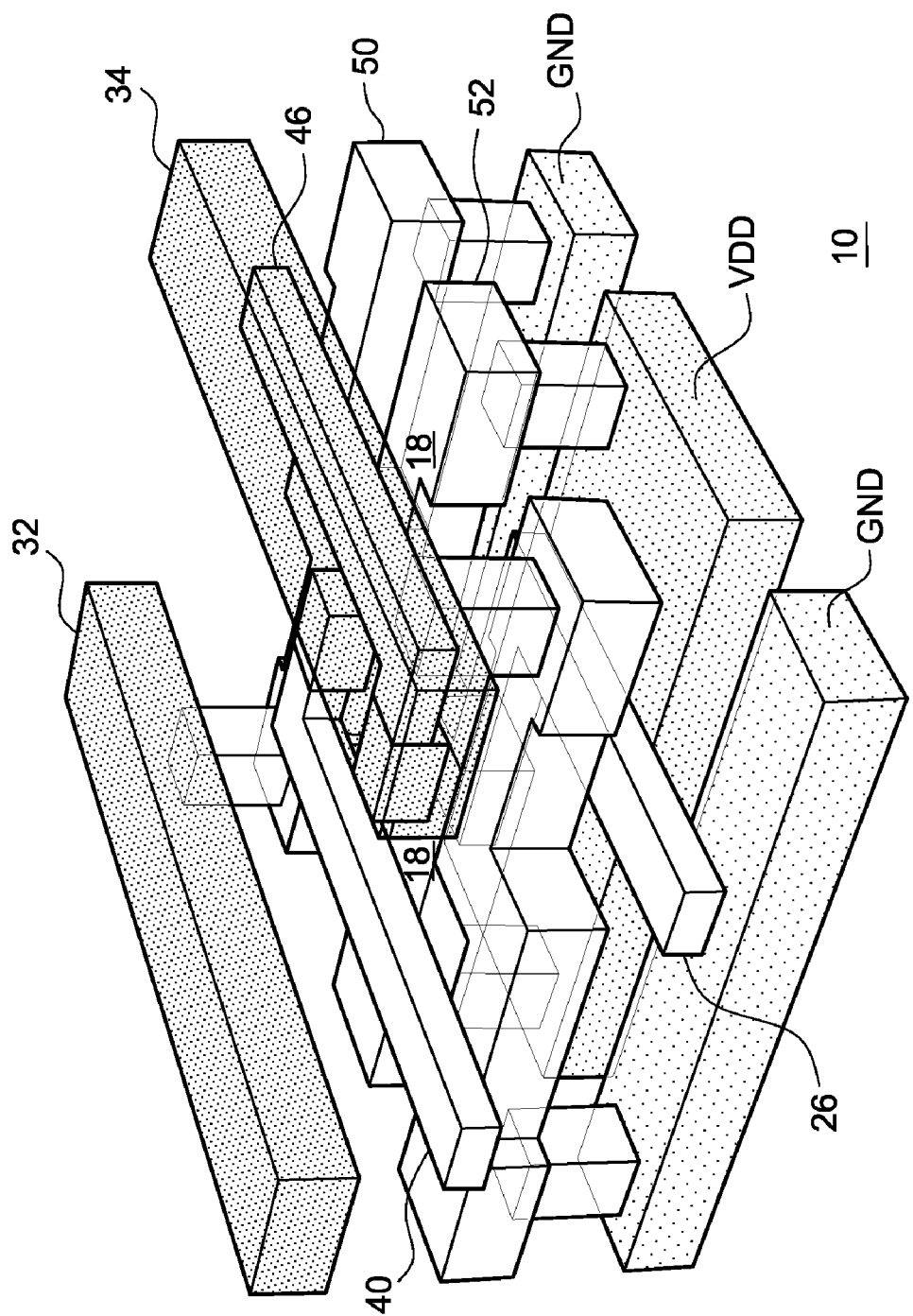
Figure 4:
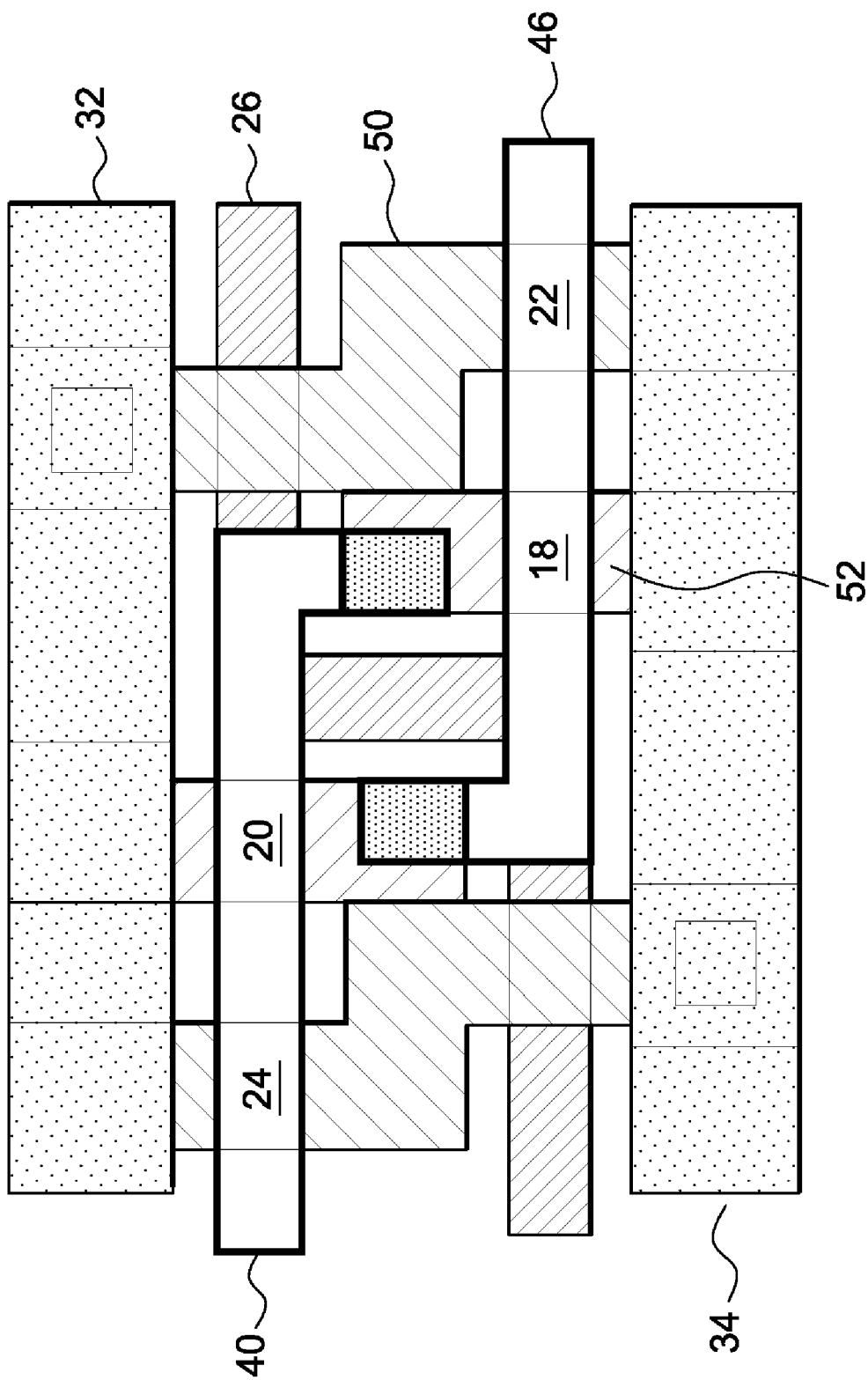
FIG. 4 is a top plan schematic illustration of the SRAM of FIG. 3.

With reference now to FIGS. 2-4, a number of illustrations are shown which illustrate how the SRAM cell 10 of FIG. 1 can be implemented with a structure constructed in accordance with the preferred embodiments of the present invention. FIGS. 2 and 3 are three dimensional simulations of the SRAM cell 10 and its various elements, but do not show the individual elements of the transistors in detail. Rather, the figures are intended to illustrate the arrangement whereby the transistor gates are formed on opposite sides of the active or channel regions of the transistors. As illustrated, the SRAM cell 10 includes an active layer region that includes a plurality of n-doped and p-doped MOS structures 50 and 52, respectively that form the channel regions of the various transistors 12, 14, 18, 20, 22 and 24. The key to the invention, however, is that the gates of the access transistors 12 and 14 are formed on the bottom sides of the channel or active regions, while the gates for the transistors 18, 20, 22 and 24 that form the cross coupled inverter 16 are formed in the top sides of the active regions. Operationally, there is no difference between the SRAM cell 10 and a conventional SRAM cell having all interconnects and gates on one side of the active layer or regions. However, by dividing the gates between both sides of the active regions, the area occupied by the SRAM cell 10 on a wafer can be substantially reduced since the spacings between the various interconnects can be reduced.

Figure 5:
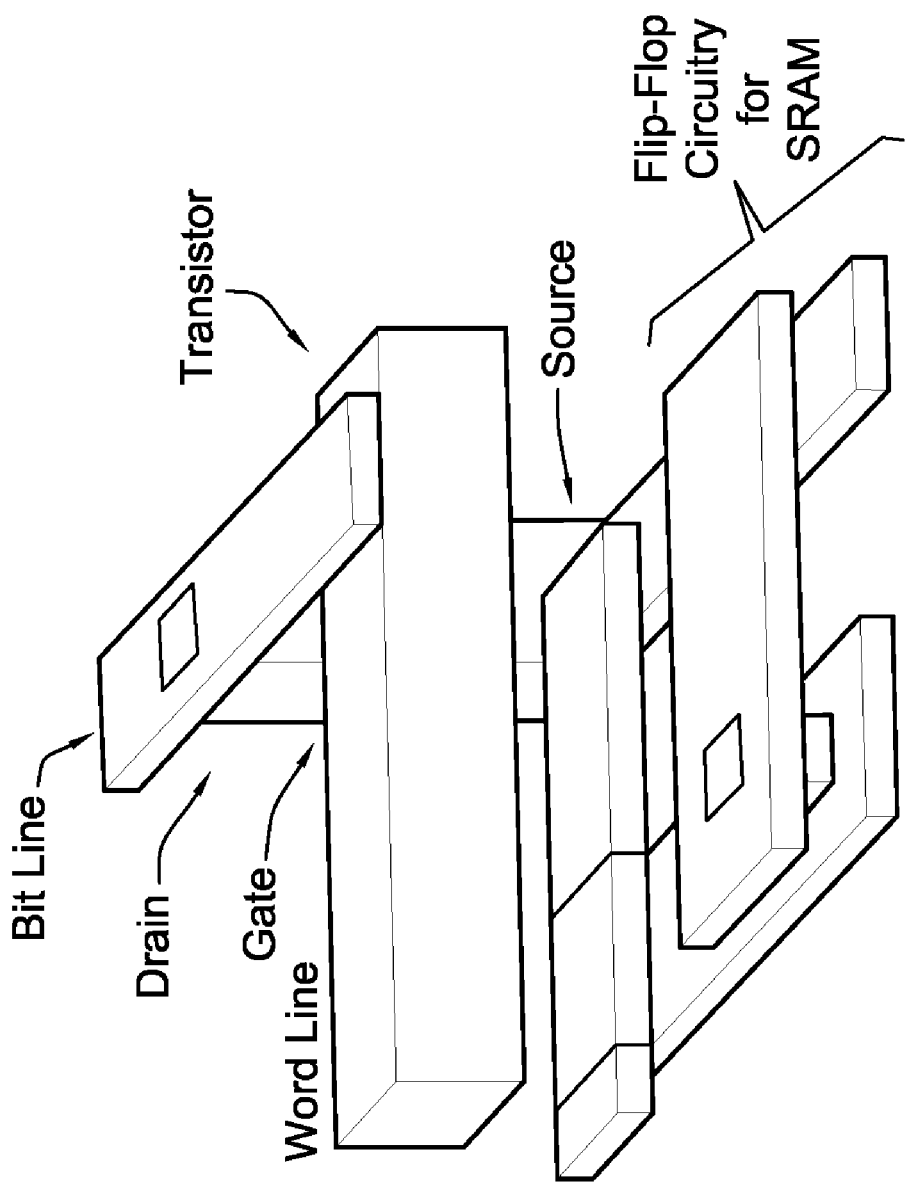
FIG. 5 is a perspective view of a simulation of an SRAM constructed in accordance with a second preferred embodiment that employs a vertically disposed access transistor.

In another variation of the invention, as illustrated in FIG. 5, by providing a vertical transistor in the structure, the SRAM cell area can be further reduced by placing the access transistor of an SRAM cell directly on top of a node of the flip-flop. In this embodiment, the transistor channel is vertically disposed and the gate is disposed either on the left or the right side of the channel.

Figure 6A:
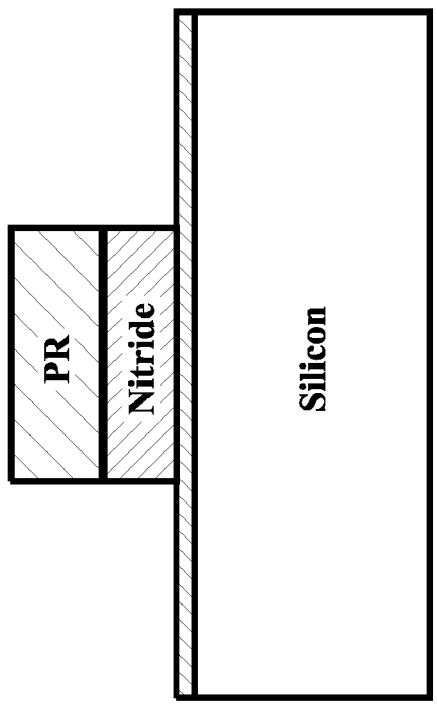
FIGS. 6A-6N are diagrammatic illustrations showing the fabrication steps that are employed in a first preferred process for forming an SRAM or other multiple transistor structure in accordance with the preferred embodiments of the present invention.
Figure 6B:
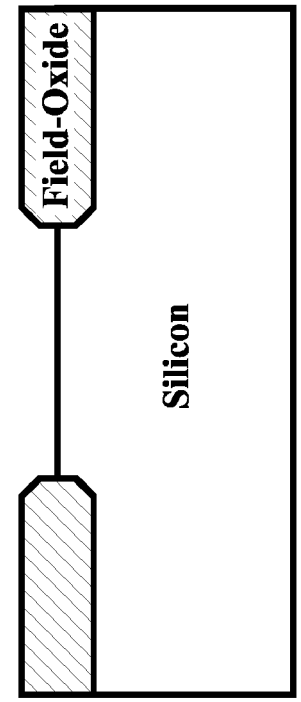
Figure 6C:
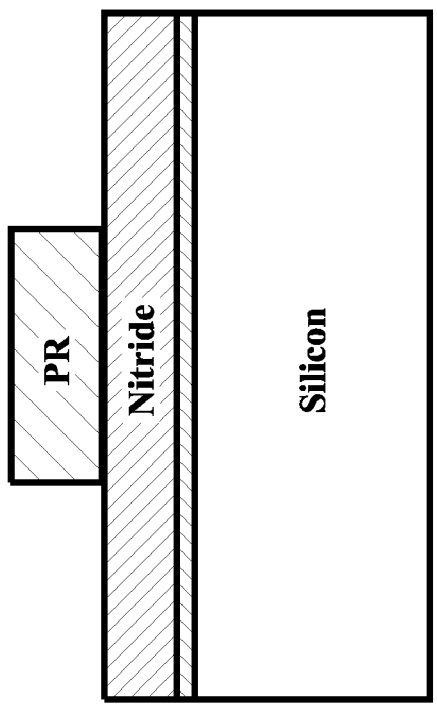
Figure 6D:
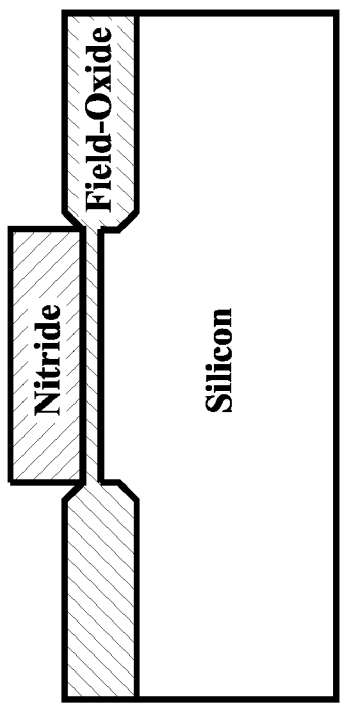
Figure 6F:
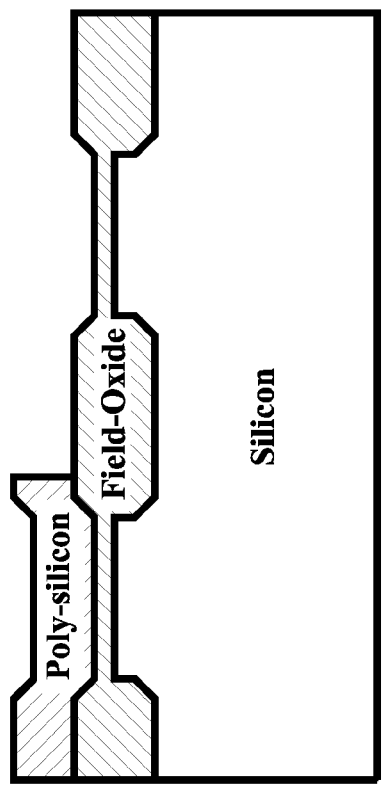
Figure 6E:
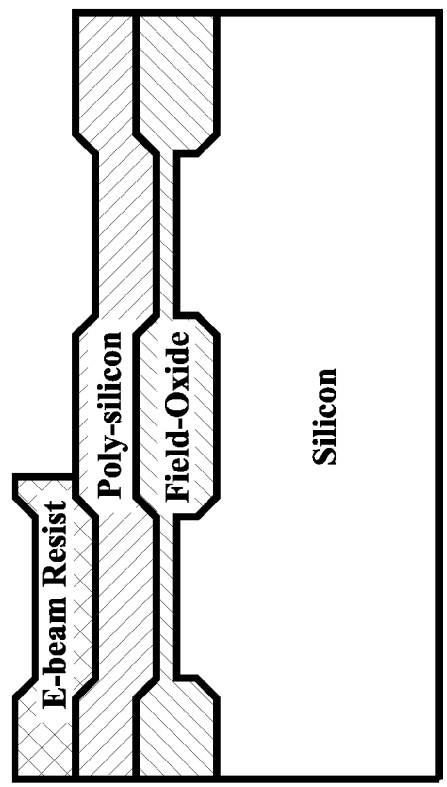
Figure 6H:
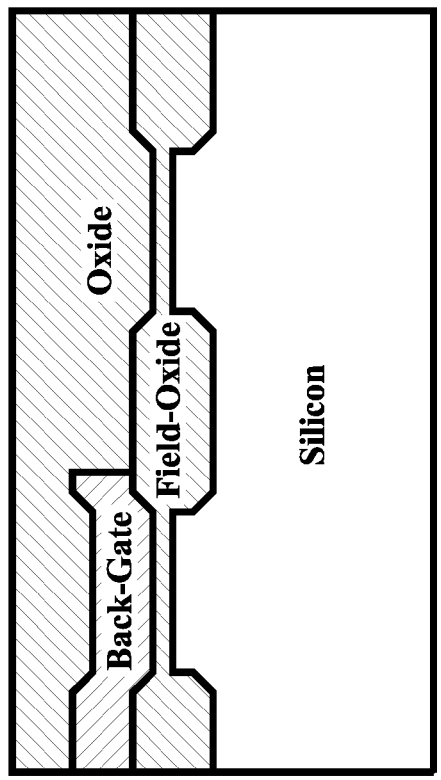
Figure 6G:
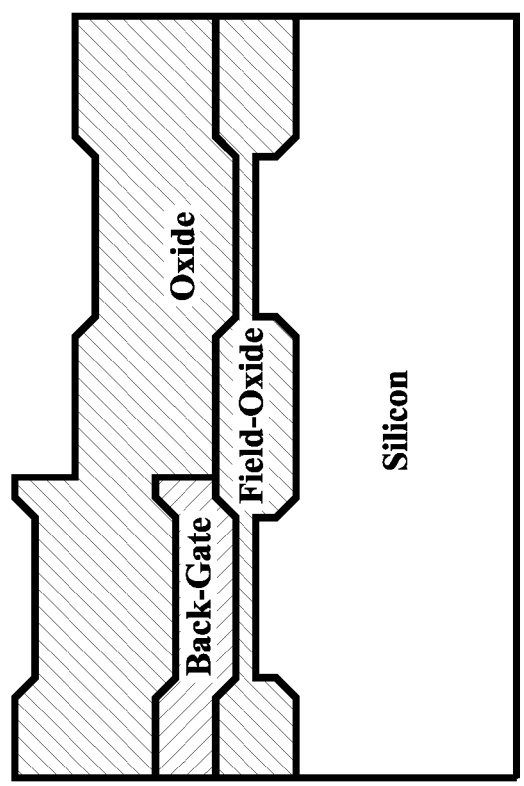
Figure 6L:
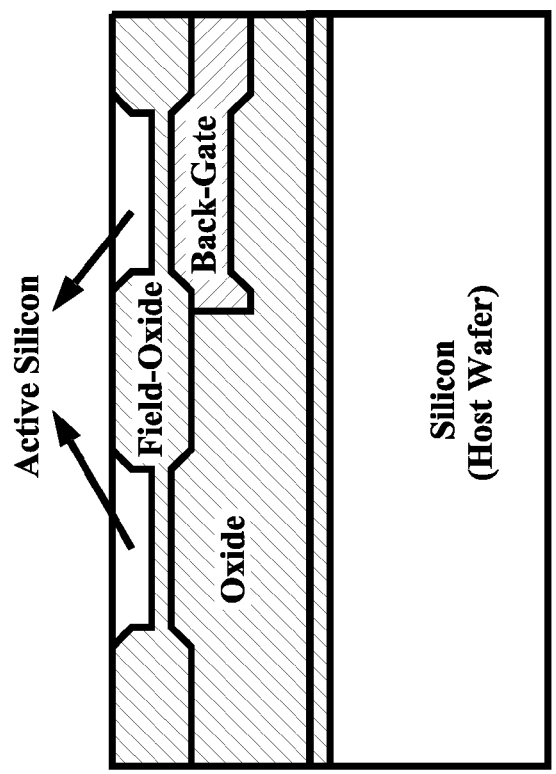
Figure 6K:
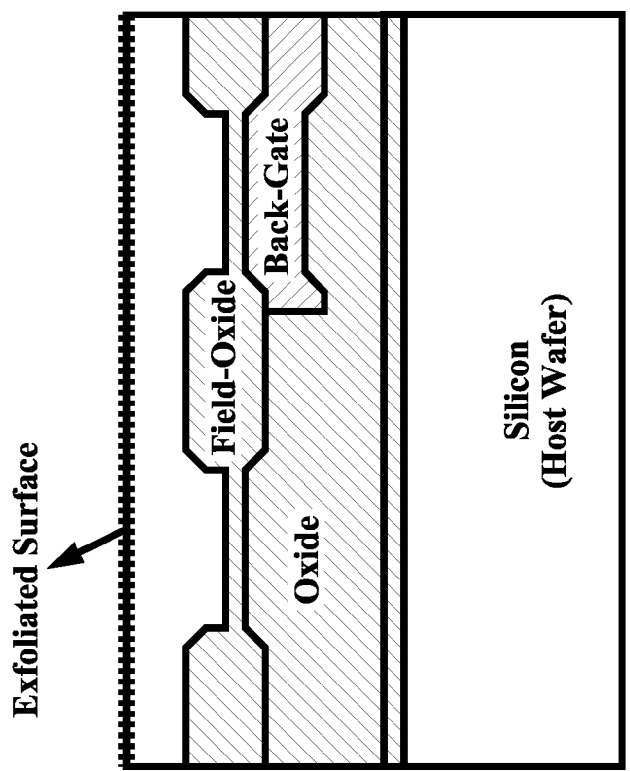

In order to fabricate the SRAM cell 10 illustrated in FIGS. 2-5, or any other multiple transistor structure in which gates are selectively formed on two opposite sides of the device channel region, a special process must be used. The steps of a first preferred fabrication process for doing so are illustrated in FIGS. 6A-6N. The process in question is basically similar to the fabrication process disclosed in the inventors' previous patent, U.S. Pat. No. 6,534,819, which issued on Mar. 18, 2003. The first four steps, as illustrated in FIGS. 6A-6D, are conventional MOS technology oxidation formation and isolation steps that are carried out in order to form a pattern of field oxide on the silicon substrate with a plurality (two shown) of apertures for formation of devices. In FIG. 6E, a thin layer of gate oxide or dielectric is formed in the aperture. Then, a layer poly silicon is deposited, which will form the actual gate. The polysilicon is patterned using lithography. After etching, a gate is formed in the first aperture but not over the second aperture. Silicon dioxide is next deposited over the entire surface as illustrated in FIG. 6G. Next, the surface is planarized using chemical mechanical polishing as illustrated in FIG. 6H. H+ or He is next implanted into the silicon wafer deep enough so that the wafer can be cleaved. The resulting structure is flipped over and bonded to another, host silicon wafer as illustrated in FIG. 6J. It should be noted that the back gate was on the left device and when flipped, it is now on the right side. As illustrated in FIG. 6K, an exfoliation step is carried out to remove the first silicon substrate down to the implant cutoff line. Chemical mechanical polishing (CMP) is then employed once again to remove the remaining silicon down to the level of the file oxide as illustrated in FIG. 6L. The polishing of the silicon stops due to high selectivity of the chemical used in CMP process. Now, gate oxide is grown for the top side followed by deposition of polysilicon. The top gate is then patterned using lithography. It should be noted that this time the left device has a top gate, but no bottom gate, whereas the right device has a bottom gate, but no top gate.

Other fabrication processes may also be employed to form the structures. For example, although the use of H+ or He implantation, followed by exfoliation is preferred for removing the first silicon substrate because it is easier and less time consuming, other removal techniques, such as chemical mechanical polishing, could be employed to remove the first silicon substrate.

It should also be noted that while the foregoing embodiment is directed specifically toward formation of an SRAM cell, the present invention is not limited to use with such structures. The inventive concepts can also be applied to any other multiple transistor structures. Contacts take most of the space in a SRAM cell and hence designs/technology always try to push them far. SOI technology offers the additional advantage of abutting p-well and n-well when they are at the same potential. Also, the active area is partitioned into two separate parts only (unlike many of commercial designs) and hence saves space. Bit lines and power supply are routed through Metal-1. Note that these (bit and power) lines can be routed on the same side using additional Metal-2. Deep submicron (DSM) MOSIS design rules are followed in the layout except for the silicide strap which connects polysilicon to active area (a reasonable 4 lambda by 2 lambda rule is employed).

The present invention includes a number of advantages over conventional planar SRAMs and devices having device gates and interconnects only on one side of the structures. As noted already, the resulting structures can be made more compact than conventional SRAM structures. In addition, the transistors on the backside can have different gate oxide and gate material from the ones of the front side.

Because of the compactness achieved through the backgate, the SRAM cell is appropriate for dense memory as well as for programmability as in field-programmable gate arrays (FPGAs). The limitations of SRAMs arise from the limitations of the transistor, and from the use of six transistors with a complex interconnect structure. SRAMs occupy a large area vis-à-vis other memories such as dynamic memories, or floating-gate memories. However, they are the memory of choice because of their high speed and low stand-by power. The ability to make the thin silicon film conduct from top as well as the bottom surface allows the partitioning of the cell for significantly higher densities than are currently possible as have been recently found (×3 improvements over planar structures for similar dimensional rules). Thus, complementary transistor technology is maintained while achieving the memory. In order to reduce the resistance of the access transistor, either the word-line needs to be strapped or it can employ tungsten as an additional gate material as demonstrated in our earlier effort.

FPGAs are an attractive design vehicle for 3D integration because limitations to FPGA performance introduced by 2D geometry can be eliminated using a 3D approach. The primary limitations to density of 2D FPGAs are the interconnect area as well as the configuration memory area required per logic block. The memory limitation can be overcome by using the subject invention's ultra-dense 3D SRAM architecture, and this can be placed in a layer below the logic tiles, allowing the FPGA to contain overlapped configuration memory and computation. In addition, the interconnect can also be placed in a layer above the logic, to provide a 3D tiered implementation of a clockless FPGA that has significantly higher density than a conventional FPGA architecture. The enhanced density also leads to reduced interconnect lengths, enhancing performance. Using a clockless approach also removes the dependence of the performance on the worst-case interconnect delay, which can be significant in an FPGA architecture due to congestion in placement and routing of logic tiles.

Although the invention has been disclosed in terms of preferred embodiments and variations thereon, it will be understood that numerous other variations and modifications could be made thereto without departing from the scope of the invention as set forth in the following claims.

What is claimed is:

1. An electronic device structure comprising:
   a three dimensional channel region having a plurality of sides;
   first and second active regions of first and second transistor structures, respectively, formed in said channel region;
   a first gate for said first transistor formed on a first of said sides of said channel region; and
   a second gate for said second transistor formed on a second of said sides of said channel region, said second side being opposite to said first side;
   wherein said transistors form a logic circuit where the logic circuit is made with said gates placed on opposite sides of said channel and co-exists with logic and control circuitry using said gates.

2. The structure of claim 1, wherein said structure is an SRAM, said first transistor is an access transistor for said SRAM cell and said second transistor is one element of a cross coupled inverter in said SRAM.

3. The structure of claim 2, wherein said SRAM further includes third, fourth, fifth and sixth transistors, said third transistor forming a second access transistor for said SRAM and having a gate formed on said first side of said active region, and said fourth, fifth and sixth transistors forming three additional elements of said cross coupled inverter and each having a gate formed on said second side of said active region.

4. The structure of claim 3, wherein said access transistor of said SRAM is a vertically disposed transistor.

5. The structure of claim 4, where said vertically disposed access transistor is selected from the group comprising n-channel and p-channel.

6. The structure of claim 5, where the vertically disposed transistor is placed at a common node heavily n-doped or heavily p-doped.

7. The structure of claim 1, wherein said first transistor is a p-channel transistor and said second transistor is an n-channel resistor.

8. The structure of claim 1, wherein said first and second gates are interconnected by a direct contact via between the two overlaying structures.

9. The structure of claim 1, wherein said gates consist of poly-silicon formed on a dielectric that is an oxide or a nitrogen containing oxide.

10. The structure of claim 1, wherein said gates are made of one or more materials selected from the group comprising metal, metal nitrides and ceramics.

11. The structure of claim 1, wherein said oppositely placed gates on the channel provide a combination of n-n, n-p, p-n, or p-p channel devices.

12. The structure of claim 1 wherein said channel is made from silicon.

13. An SRAM structure comprising:
  a three dimensional channel region having a plurality of sides and first and second active regions of first and second transistor structures formed therein, respectively, wherein said first transistor is an access transistor for said SRAM and said second transistor is one element of a cross coupled inverter in said SRAM;
  a first gate for said first transistor formed on a first of said sides of said channel region;
  a second gate for said second transistor formed on a second of said sides of said channel region, said second side being opposite to said first side; and
  third, fourth, fifth and sixth transistors, said third transistor forming a second access transistor for said SRAM and having a gate formed on said first side of said active region, and said fourth, fifth and sixth transistors forming three additional elements of said cross coupled inverter and each having a gate formed on said second side of said active region.

14. The SRAM structure of claim 13, wherein said first transistor is a p-channel transistor and said second transistor is an n-channel resistor.

15. The SRAM structure of claim 13, wherein said first and second gates are interconnected by a direct contact via between the two overlaying structures.

16. The SRAM structure of claim 13, wherein said gates consist of poly-silicon formed on a dielectric that is an oxide or a nitrogen containing oxide.

17. The SRAM structure of claim 13, wherein said gates are made of one or more materials selected from the group comprising metal, metal nitrides and ceramics.

18. . The SRAM structure of claim 13, wherein said oppositely placed gates on the channel provide a combination of n-n, n-p, p-n, or p-p channel devices.

19. The SRAM structure of claim 13, wherein said access transistor is a vertically disposed transistor.

20. The SRAM structure of claim 19, where said vertically disposed access transistor is selected from the group comprising n-channel and p-channel.

21. The SRAM structure of claim 20, where the vertically disposed transistor is placed at a common node that is heavily n-doped or heavily p-doped.

22. The SRAM structure of claim 13, wherein said channel is formed from silicon.

* * * * *